(12) United States Patent
Hendricks

(10) Patent No.: US 11,546,492 B2
(45) Date of Patent: Jan. 3, 2023

(54) IMAGER ASSEMBLY WITH HEATING ELEMENT

(71) Applicant: GENTEX CORPORATION, Zeeland, MI (US)

(72) Inventor: Michael G. Hendricks, Hamilton, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 17/543,909

(22) Filed: Dec. 7, 2021

(65) Prior Publication Data

US 2022/0201175 A1 Jun. 23, 2022

Related U.S. Application Data

(60) Provisional application No. 63/129,041, filed on Dec. 22, 2020.

(51) Int. Cl.
*H04N 5/225* (2006.01)
*H01L 27/146* (2006.01)

(52) U.S. Cl.
CPC ... *H04N 5/22521* (2018.08); *H01L 27/14618* (2013.01); *H01L 27/14627* (2013.01); *H04N 5/2252* (2013.01); *H04N 5/2254* (2013.01)

(58) Field of Classification Search
CPC ........ H01L 27/14618; H01L 27/14627; H04N 5/2252; H04N 5/22521; H04N 5/2254
See application file for complete search history.

(56) References Cited

U.S. PATENT DOCUMENTS

| 2013/0070102 | A1 | 3/2013 | Gustafson et al. | |
|---|---|---|---|---|
| 2017/0297504 | A1 | 10/2017 | Leonelli, Jr. | |
| 2019/0208091 | A1* | 7/2019 | Mleczko | H04N 5/2254 |
| 2020/0076994 | A1* | 3/2020 | Kunze | H04N 5/2254 |
| 2020/0314311 | A1* | 10/2020 | Liu | G02B 7/028 |

FOREIGN PATENT DOCUMENTS

WO 2020139471 A1 7/2020

OTHER PUBLICATIONS

International Search Report dated Mar. 10, 2022, for corresponding PCT application No. PCT/US2021/062100, 2 pages.
Written Opinion dated Mar. 24, 2022, for corresponding PCT application No. PCT/US2021/062100, 5 pages.

* cited by examiner

*Primary Examiner* — Amy R Hsu
(74) *Attorney, Agent, or Firm* — Price Heneveld LLP; Brian James Brewer

(57) ABSTRACT

An imager assembly is disclosed. The imager assembly may have a camera sensor, a circuit board, an electrical contact assembly, and/or a lens assembly. The camera sensor may be operable to generate an image upon exposure to light. The electrical contact assembly may be electrically connected to the circuit board and operable to receive power therefrom. Additionally, the electrical contact assembly may comprise first and second spring contacts. The lens assembly may comprise a lens operable to gather and focus light onto the camera sensor. Further, the lens assembly may comprise a heating element. The heating element may be operable to heat the lens. Further, the heating element may comprise third and fourth contacts, where the third and fourth contacts may engage the first and second contacts, respectively. The engagement may be operable to transmit power.

13 Claims, 5 Drawing Sheets

IMAGER ASSEMBLY WITH HEATING ELEMENT

CROSS-REFERENCE TO RELATED APPLICATIONS

This application claims priority under 35 U.S.C. § 119(e) to U.S. Provisional Application No. 63/129,041 filed on Dec. 22, 2020, entitled "IMAGER ASSEMBLY WITH HEATING ELEMENT," the disclosure of which is hereby incorporated by reference in its entirety.

FIELD OF INVENTION

The present invention relates, in general, to imaging devices and, more particularly, to imaging devices with heating a heating element.

BACKGROUND OF INVENTION

Cameras for imaging are well know and commonly used on vehicles. Often, these cameras are used to capture images of scenes rearward and/or forward a vehicle on which they are disposed. Further, the image may be communicated to a display for viewing by a vehicle occupant. The conditions to which these cameras are subject often require competing features. For example, due to exposure to the vehicle exterior, the camera must be waterproof. Additionally, due to exposure to low temperatures, the camera must also have a heater to warm the lens of the camera. However, providing such features, while also having a camera that is easy and cost effective to manufacture, may be difficult. Measures taken to enhance waterproofing may interfere with providing the heater, or vice versa, especially when the camera must be easy and cost effective to manufacture. Accordingly, there is a need for an improved camera.

DETAILED DESCRIPTION

For the purposes of description herein, the specific devices and processes illustrated in the attached drawings and described in this disclosure are simply exemplary embodiments of the inventive concepts defined in the appended claims. Hence, specific characteristics relating the embodiments disclosed herein are not to be considered limiting, unless the claims expressly state otherwise.

Figure 1:
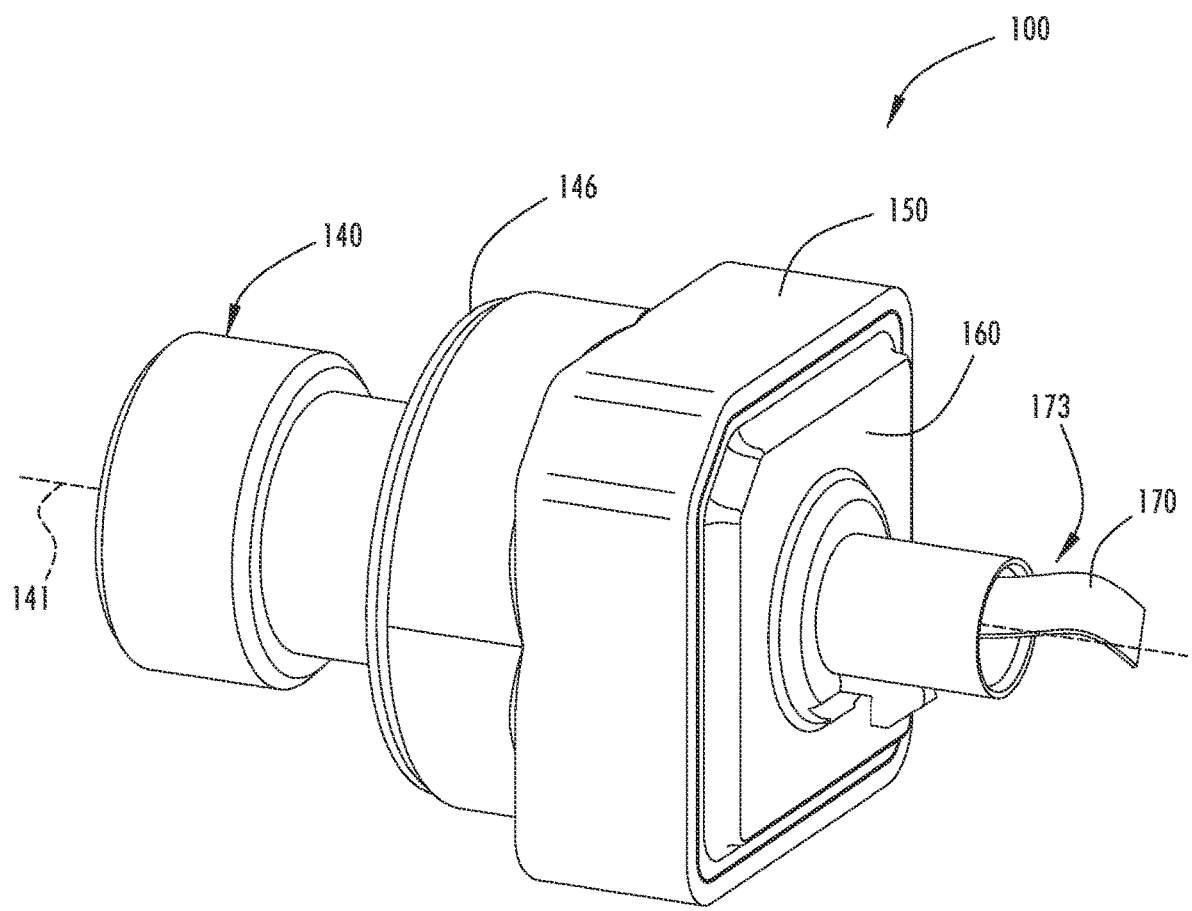
FIG. 1: A perspective view of an embodiment of an imager assembly.
Figure 2:
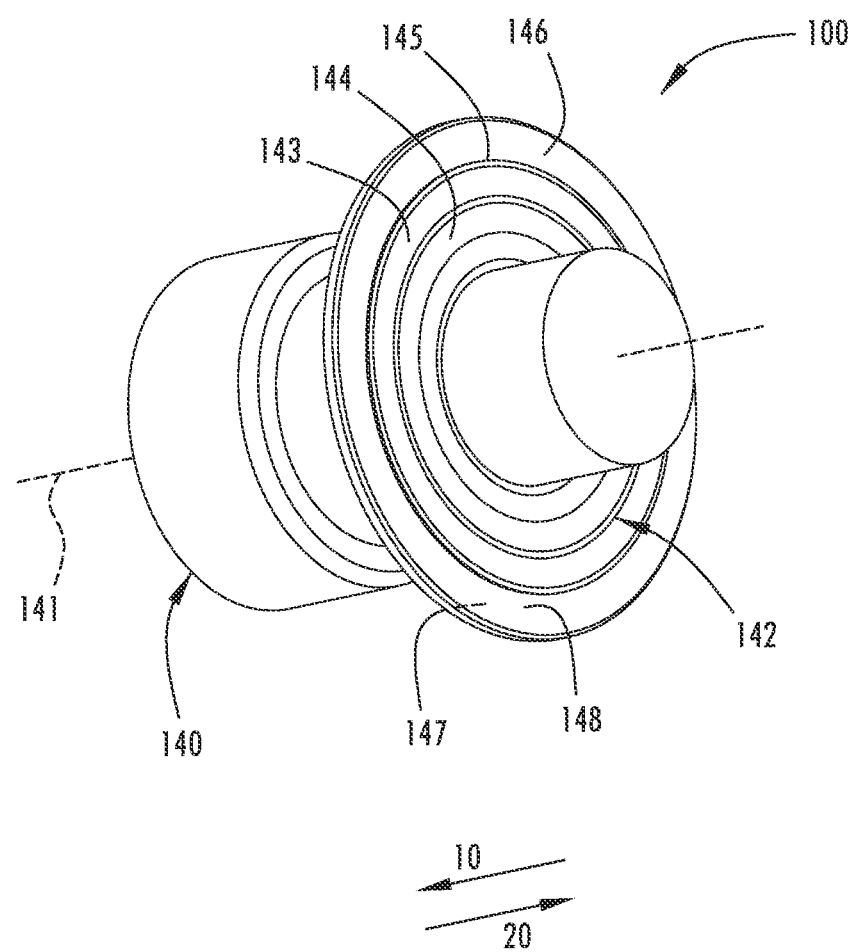
FIG. 2: A perspective view of an embodiment of a lens assembly.
Figure 3:
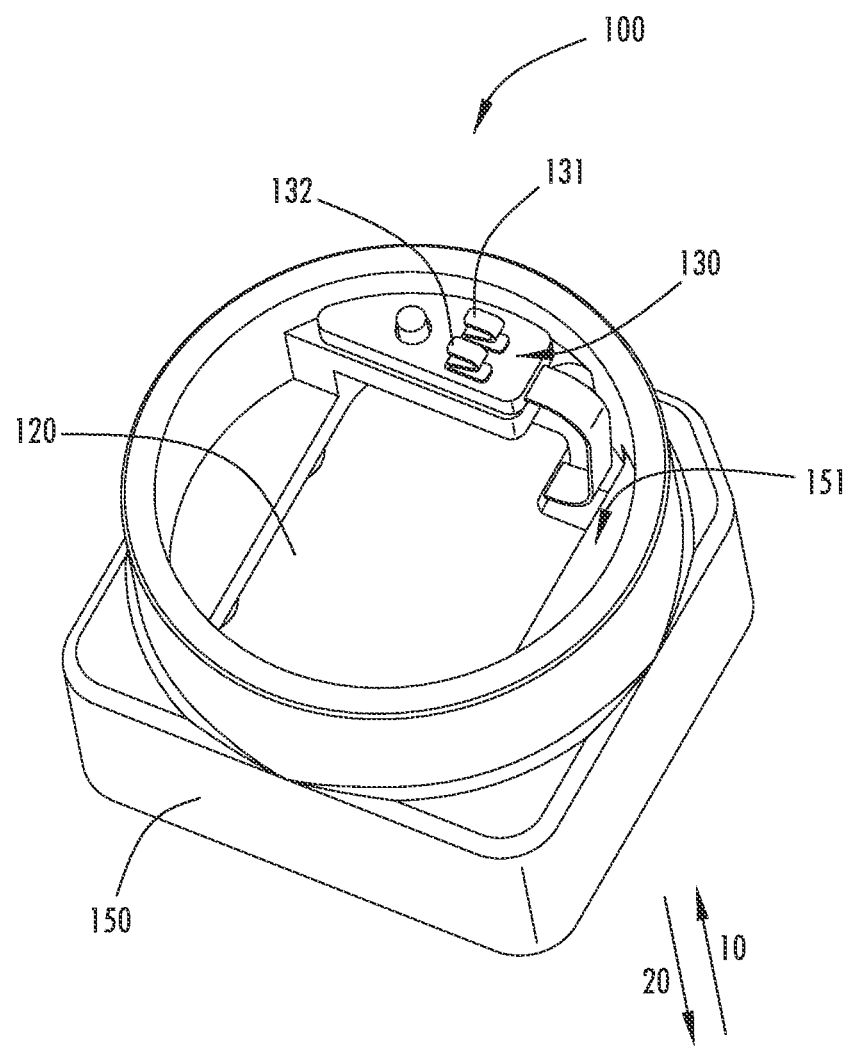
FIG. 3: A first perspective view of a portion of an embodiment of an imager assembly.
Figure 4:
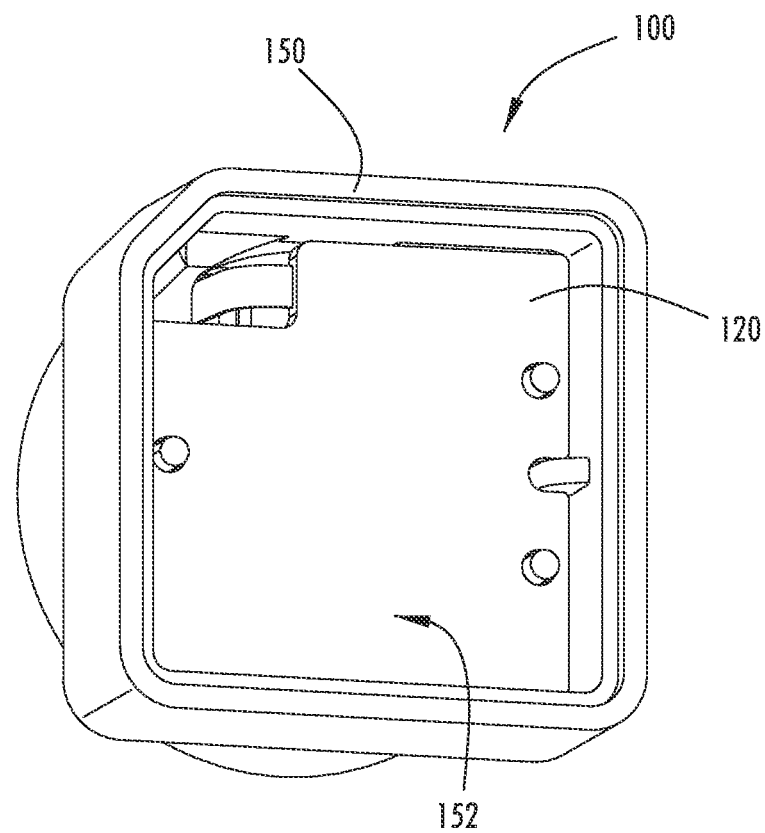
FIG. 4: A second perspective view of a portion of an embodiment of an imager assembly.
Figure 5:
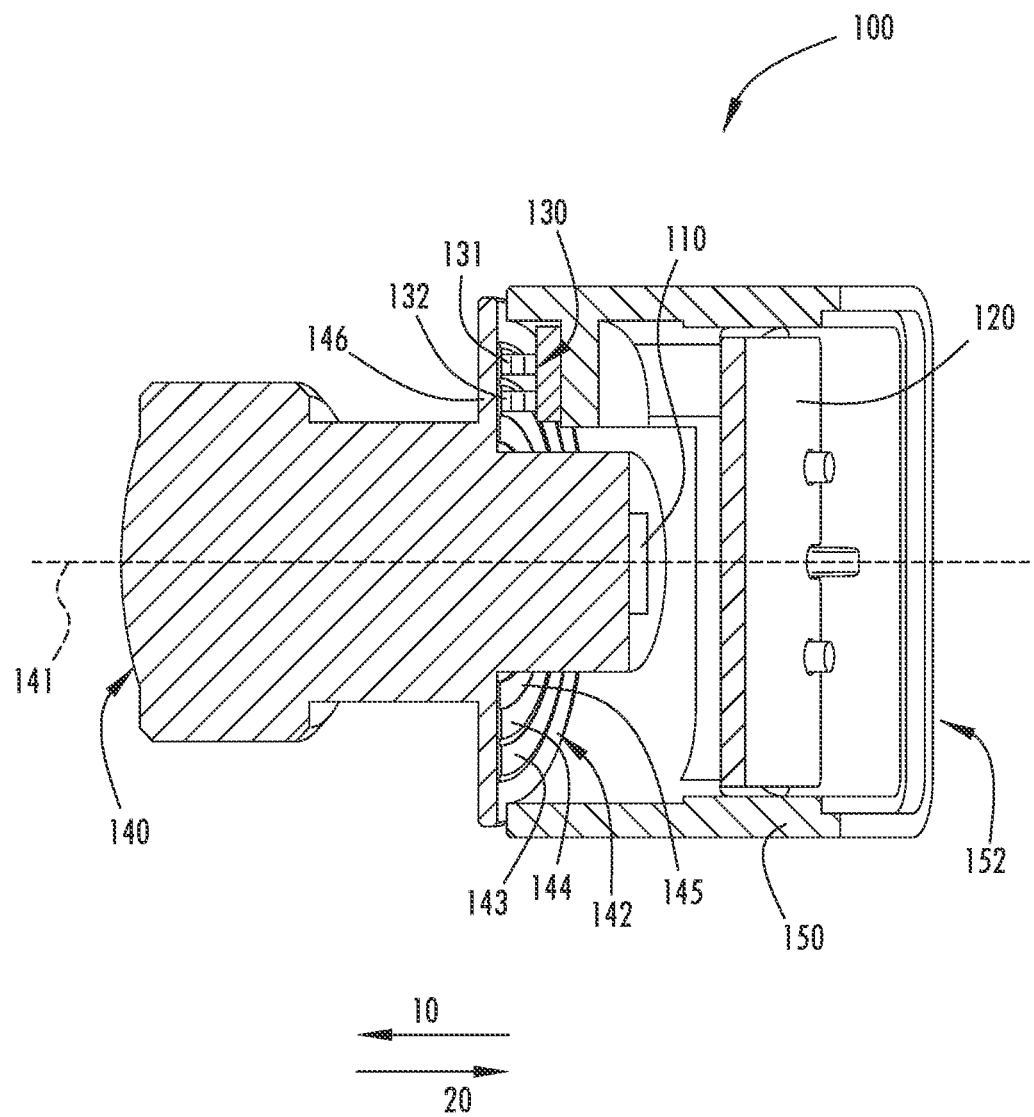
FIG. 5: A cross-sectional view of an embodiment of an imager assembly.

The present disclosure is directed to an imager assembly 100. Accordingly, FIGS. 1-5 illustrate various aspects of an imager assembly 100. Imager assembly 100 may be operable to capture an image of a scene. The scene may be exterior and/or to the rear of a vehicle. Further, for example, imager assembly 100 may be disposed on a rear window, a side window, a front windshield, a dashboard, a headliner, a roof, a trailer, a tailgate, a rear bumper, a trunk lid, a rearview assembly, a side panel, a door, or a sail panel of the vehicle. Therefore, imager assembly 100, for example, may serve as a side-view, a front view, a rearview, or a back-up camera for a digital video recorder (DVR), a rearview assembly, a rear camera display, a forward display, and/or an augmented reality display. Furthermore, imager assembly 100 may comprise a camera sensor 110, a circuit board 120, an electrical contact assembly 130, a lens assembly 140, a housing 150, a fitting 160, and/or a wire harness 170.

Camera sensor 110 may be a device operable to capture light in the infra-red, near infra-red, and/or visible regions of the electromagnetic spectrum and produce a digital image. For example, camera sensor 110 may be a Semi-Conductor Charge-Coupled Device (CCD) or a pixel sensor of Complementary Metal-Oxide-Semi-Conductor (CMOS) technologies.

Circuit board 120 may be a structure of electronic components. For example, circuit board 120 may be a printed circuit board (PCB). Circuit board 120 may be operable to supply electrical power. Additionally, circuit board 120 may be communicatively connected to camera sensor 100. Accordingly, circuit board 120 may be operable to receive the digital image from camera sensor 100. Further, circuit board 120 may be operable to transmit a second image to a display. The second image may be based, at least in part, on the digital image. In some embodiments, the second image and the digital image may be the same. The display may be disposed interior the vehicle for viewing by an occupant of the vehicle, such as the driver.

Electrical contact assembly 130 may comprise a first contact 131 and a second contact 132. The first and second contacts 131, 132 may correspond to opposite electrical polarities. For example, first contact 131 may correspond to a positive electrical polarity contact and second contact 132 may correspond to a negative electrical polarity contact. Further, the first and second contacts 131, 132 may each be comprised of an electrically conducive material. In some embodiments, the first and second contacts 131, 132 may face a first direction 10. Additionally, each of the first and second contacts 131, 132 may be a spring contact. Accordingly, each of the first and second contacts 131, 132 may be physically biased to a first position. The physical bias may be in first direction 10. Further, each of the first and second contacts 131, 132 may be physically displaced into a second position. The displacement may be in a second direction 20. Second direction 20 may be opposite first direction 10. The first position may correspond to a physically extended position. Conversely, the second position may correspond to a physically retracted or compressed position. Further, electrical contact assembly 130 may be electrically connected to circuit board 120. Accordingly, electrical contact assembly 130 may be operable to receive power from circuit board 120 via the electrical connection therewith.

Lens assembly 140 may be operable to gather and focus light onto camera sensor 110 for imaging. Accordingly, lens assembly 140 may comprise a lens barrel and/or one or more optical lenses. Therefore, lens assembly 140 may comprise an optical axis 141. Optical axis 141 may intersect camera sensor 110. Additionally, lens assembly 140 may further comprise a heating element 142. The first direction 10 may be substantially parallel to optical axis 141. Further, an object of lens assembly 140 and/or lens assembly 140 itself may be substantially disposed in the first direction relative camera sensor 110.

Heating element 142 may be operable to heat when power is applied thereto. Accordingly, in some embodiments, heating element 142 may be an electrically resistive heater. In some embodiments, heating element 142 may be disposed circumferentially about optical axis 141, the lens barrel, and/or the one or more optical lenses. Further, heating element 142 may comprise a third contact 143 and a fourth contact 144. Each of third contact 143 and fourth contact 144 may be electrically conductive and operable to engage first contact 131 and second contact 132, respectively, and receive power therefrom. Accordingly, the third and fourth contacts 143, 144 may correspond to opposite electrical polarities. For example, third contact 143 may correspond to a positive electrical polarity contact and fourth contact 144 may correspond to a negative electrical polarity contact. In some embodiments, the third and fourth contacts 143, 144 may face the second direction 20. Further, the third and fourth contacts 143, 144 may each be operable to physically displace the first and second contacts 131, 132, respectively. In some embodiments, each of the third and fourth contacts 143, 144 may correspond to individual bus bars. Further, in some embodiments, each of the third and fourth contacts 143, 144 may be circumferentially disposed about, optical axis 141, the lens barrel, and/or one or more optical lenses. Further, heating element 142 may further comprise an electrically resistive material 145 disposed between and electrically connecting the third and fourth contacts 143, 144. As such, the electrically resistive material 145 may be operable to heat up. The generated heat may be radiated and/or conducted to the lens barrel and/or one or more of the optical lenses. Accordingly, in operation, heating element 145 may be operable to prevent, reduce, or remove frost build up from one or more lens of lens assembly 140. Additionally, electrically resistive material 145 may likewise be disposed about, optical axis 141, the lens barrel, and/or one or more optical lenses.

In some embodiments, lens assembly 140 may further comprise a flange 146. Flange 146 may be disposed circumferentially about optical axis 141, the lens barrel, and/or one or more of the optical lenses. Heating element 142 may be associated with flange 146. Accordingly, heating element 142 may be disposed on flange 146. Further, flange 146 may have a first side 147 and a second side 148 on opposite sides thereof. Second side 148 may be disposed in the second direction 20 relative first side 147. In some embodiments, heating element 142 may be disposed on second side 148. Specifically, electrically resistive material 145 may be disposed on second side 148 and the third and fourth contacts 143, 144 about, optical axis 141, the lens barrel, and/or one or more optical lenses may be disposed thereon.

Housing 150 may be an object operable to substantially enclose one or more objects therewithin. For example, housing 150 may be operable to substantially enclose camera sensor 110, circuit board 120, and/or electrical contact assembly 130. The enclosure may be substantially waterproof. In some embodiments, housing 150 may comprise a first aperture 151 and/or a second aperture 152. First aperture 151 and second aperture 152 may be substantially disposed on opposite sides of housing 150. First aperture 151 may be disposed in second direction 20 relative second aperture 152 and/or circuit board 120. Conversely, second aperture 152 may be disposed in first direction 10 relative first aperture 151 and/or circuit board 120. In some embodiments, the third and fourth contacts 143, 144 may be disposed in or proximate first aperture 151. In some embodiments, flange 146 may be disposed in or in abutment with first aperture 151. Accordingly, in some embodiments, second side 148 may be substantially align with, be proximate to, or abut first aperture 151. Further, an association between flange 146 and first aperture 151 may be watertight. The association may be aided by an adhesive or weld.

Fitting 160 may comprise a third aperture 173 transecting therethrough. Further, fitting 160 may be disposed in or in abutment with second aperture 152. Additionally, an association between fitting 160 and second aperture 152 may be watertight. The association may be aided by an adhesive or weld.

Wire harness 170 may be communicatively and/or electrically connected to circuit board 120. Accordingly, wire harness 170 may be operable to supply power to circuit board 120 and/or receive and relay the second image from circuit board 120. Further, wire harness 170 may extend through second aperture 152. Additionally, wire harness 170 may extend through third aperture 173.

Some embodiments of the present disclosure may have the advantage of an improved imager assembly 100. Imager assembly 100 may have a heated lens assembly and thereby be operable to prevent, reduce, or remove frost build up from one or more lens of lens assembly 140. Further, the imager assembly 100 may be operable to supply the heating element 142 with power via circuit board 120 in conjunction with electrical contact assembly 130. Such an arrangement may serve to eliminate a need for a second wire harness to heating element 142. Specifically, the electrical connection between the first and second contacts 131, 132 and the third and fourth contacts 143, 144, respectively, may be induced simply by association of lens assembly 140 with housing 150. The elimination of a second wire harness may serve to significantly reduce manufacturing costs and increase the ease of assembly. Furthermore, these advantages may be achieved while also achieving a substantially waterproof imager assembly 100.

As used herein, the term "and/or," when used in a list of two or more items, means that any one of the listed items can be employed by itself, or any combination of the two or more of the listed items can be employed. For example, if a composition is described as containing components A, B, and/or C, the composition can contain A alone; B alone; C alone; A and B in combination; A and C in combination; A and C in combination; B and C in combination; or A, B, and C in combination.

For purposes of this disclosure, the term "associated" generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

In this document, relational terms, such as "first," "second," and the like, are used solely to distinguish one entity or action from another entity or action, without necessarily requiring or implying any actual such relationship or order between such entities or actions.

The term "substantially," and variations thereof, will be understood by persons of ordinary skill in the art as describing a feature that is equal or approximately equal to a value or description. For example, a "substantially planar" surface is intended to denote a surface that is planar or approximately planar. Moreover, "substantially" is intended to denote that two values are equal or approximately equal. If there are uses of the term which are not clear to persons of ordinary skill in the art, given the context in which it is used, "substantially" may denote values within about 10% of each other, such as within about 5% of each other, or within about 2% of each other.

The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It is to be understood that although several embodiments are described in the present disclosure, numerous variations, alterations, transformations, and modifications may be understood by one skilled in the art, and the present disclosure is intended to encompass these variations, alterations, transformations, and modifications as within the scope of the appended claims, unless their language expressly states otherwise.

What is claimed is:

1. An assembly, comprising:
    a camera sensor operable to generate an image upon exposure to light;
    a circuit board;
    an electrical contact assembly electrically connected to the circuit board and operable to receive power therefrom, the electrical contact assembly comprising a first spring contact and a second spring contact;
    a lens assembly comprising:
        a lens operable to gather and focus light onto the camera sensor,
        a heating element operable to heat the lens, the heating element comprising a third contact and a fourth contact, wherein the third and fourth contacts engage the first and second contacts, respectively, and the engagement is operable to transmit power, and
        a flange disposed circumferentially about the optical axis of the lens assembly; and
    a housing having a first aperture and a second aperture;
    wherein:
        the circuit board and the electrical contact assembly are disposed in the housing, and
        the flange is operable to abut the first aperture.

2. The assembly of claim 1, further comprising: a wire harness disposed through the second aperture and connected to the circuit board, the wire harness operable to provide power to the circuit board.

3. The assembly of claim 1, wherein an association between the first aperture and the flange is watertight.

4. The assembly of claim 1, further comprising a fitting disposed in watertight abutment with the second aperture.

5. The assembly of claim 4, wherein a wire harness connected to the circuit board extends through a third aperture in the fitting.

6. An assembly, comprising:
    a camera sensor operable to generate an image upon exposure to light;
    a circuit board;
    an electrical contact assembly electrically connected to the circuit board and operable to receive power therefrom, the electrical contact assembly comprising a first spring contact and a second spring contact; and
    a lens assembly comprising:
        a lens operable to gather and focus light onto the camera sensor,
        a heating element operable to heat the lens, the heating element comprising a third contact and a fourth contact, wherein the third and fourth contacts engage the first and second contacts, respectively, and the engagement is operable to transmit power;
    wherein:
        the heating element is disposed circumferentially about an optical axis of the lens assembly;
        the lens assembly further comprises a flange disposed circumferentially about the optical axis of the lens assembly;
        the heating element is associated with the flange;
        the first and second spring contacts are physically biased in a first direction, the first direction substantially parallel to the optical axis of the lens assembly and in a direction of an objective of the lens assembly;
        the third and fourth contacts face a second direction and are each operable to physically displace one of the first and second spring contacts in the second direction, the second direction opposite the first direction;
        each of the third and fourth contacts are individual bus bars of the heating element; and
        each of the third and fourth contacts are circumferentially disposed about the optical axis.

7. The assembly of claim 6, comprising no additional wire harnesses.

8. The assembly of claim 6, wherein the housing is waterproof.

9. The assembly of claim 6, wherein the camera sensor is operable to image a scene rearward relative a vehicle.

10. The assembly of claim 6, wherein the heating element further comprises a resistively heatable material connecting the third and fourth contacts.

11. The assembly of claim 6, wherein the third and fourth contacts are disposed circumferentially about an optical axis of the lens assembly.

12. The assembly of claim 6, wherein the heating element further comprises an electrically resistive material electrically connecting the third and fourth contacts.

13. An assembly, comprising:
    a camera sensor operable to generate an image upon exposure to light;
    a circuit board;
    an electrical contact assembly electrically connected to the circuit board and operable to receive power therefrom, the electrical contact assembly comprising a first spring contact and a second spring contact; and
    a lens assembly comprising:
        a lens operable to gather and focus light onto the camera sensor,
        a heating element operable to heat the lens, the heating element comprising a third contact and a fourth contact, wherein the third and fourth contacts engage the first and second contacts, respectively, and the engagement is operable to transmit power;
    wherein:
        the heating element is disposed circumferentially about an optical axis of the lens assembly;
        the lens assembly further comprises a flange disposed circumferentially about the optical axis of the lens assembly;
        the heating element is associated with the flange;
        the flange has a first side and a second side disposed on opposite sides thereof, the first side disposed in the first direction relative the second side, the first direction substantially parallel to the optical axis and in a direction of an objective of the lens assembly, and
the heating element is disposed on the second side.

\* \* \* \* \*